United States Patent [19]

Hornak et al.

[11] 4,405,916

[45] Sep. 20, 1983

[54] DIGITAL-TO ANALOG CONVERTER HAVING SUPPLEMENTARY CURRENTS TO ENHANCE LOW CURRENT SWITCHING SPEED

[75] Inventors: Thomas Hornak, Portola Valley; Gary L. Baldwin, Palo Alto, both of Calif.

[73] Assignee: Hewlett-Packard Company, Palo Alto, Calif.

[21] Appl. No.: 341,384

[22] Filed: Jan. 21, 1982

[51] Int. Cl.³ .............................................. H03K 13/02
[52] U.S. Cl. ....................... 340/347 DA; 340/347 CC
[58] Field of Search ....................... 307/270, 577, 584; 340/347 DA, 347 CC

[56] References Cited

U.S. PATENT DOCUMENTS

4,056,740 11/1977 Schoeff ........................ 340/347 DA
4,131,884 12/1978 Comer ......................... 340/347 DA
4,138,671 2/1979 Comer ......................... 340/347 DA
4,309,693 1/1982 Craven ........................ 340/347 DA Primary Examiner—C. D. Miller
Attorney, Agent, or Firm—John A. Frazzini

[57] ABSTRACT

A bit cell is presented which can provide a small weighted current without loss of switching speed. The bit cell contains a switch which is responsive to an applied control signal to direct the weighted current to an output or to divert it away from the output. Supplementary currents are supplied to the switch to provide sufficient current to the switch to charge and discharge parasitic capacitances of the switch within the switching time of the control voltage. The supplementary currents maximize switching speed at a given power dissipation and produce a constant offset current at the switch output. A D/A converter is presented which utilizes a plurality of such bit cells to maximize the speed of D/A conversion. The offset currents are eliminated from the converter output so that the output current is proportional to the digital input.

15 Claims, 6 Drawing Figures

DIGITAL-TO ANALOG CONVERTER HAVING SUPPLEMENTARY CURRENTS TO ENHANCE LOW CURRENT SWITCHING SPEED

BACKGROUND OF THE INVENTION

This invention relates generally to digital-to-analog (D/A) converters and particularly to current-weighting D/A converters having small weighted currents.

In an n-bit current weighting D/A converter (also rereferred to as a DAC) the digital input is represented as an n-bit binary number and each bit has a corresponding weighted current. The weighted currents $I_1 \ldots, I_n$ are related by $I_k = 2^{k-1} I_1$ where k is an integer in the range of $1 \leq k \leq n$, where the kth weighted current corresponds to the kth bit of the n-bit binary number and where k=1 corresponds to the least significant bit. For each bit which is equal to 1 a corresponding weighted current is coupled to the output of the D/A converter and for each bit which is equal to 0 a corresponding weighted current is diverted away from the output of the D/A converter. In this manner the magnitude of the output current at the output of the D/A converter is proportional to the n-bit binary number.

Figure 1:
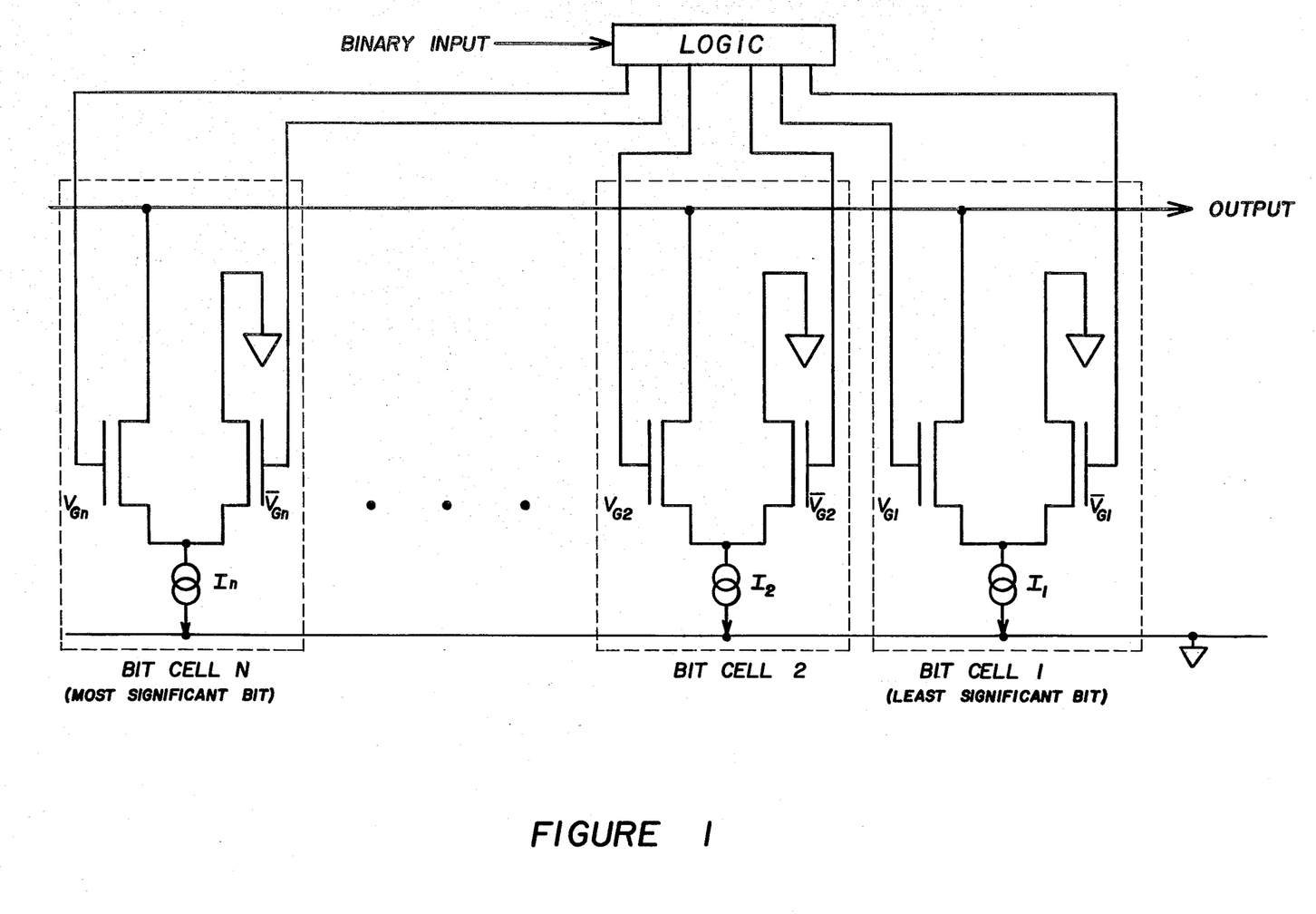
FIG. 1 illustrates a circuit for a weighted current D/A converter as known in the prior art.

High speed switching of the weighted currents can be achieved by use of MOSFETs as shown in FIG. 1. In response to the n-bit binary number a logic circuit produces pairs of complementary gate voltages $V_{Gk}$ and $\overline{V}_{Gk}$ which are applied to the gates of the MOSFETs. The gate voltage $V_{Gk}$ corresponding to the kth bit is high if the kth bit is 1 and is low if the kth bit is 0. The weighted current from the kth current source is thereby routed to the output if the kth bit is 1 and is routed to ground if the kth bit is 0.

In order to maintain low power dissipation it is desirable to employ a low value for $I_n$. Since $I_1 = 2^{1-n} I_n$ the resulting magnitude of $I_1$ can be quite small. One consequence of such a small value for $I_1$ is that parasitic capacitances associated with the switches conducting the least significant weighted currents cause long settling times. To preserve switching speed the current through each transistor should be sufficient to charge or discharge the parasitic capacitance within the switching time $T_S$ of its gate voltage.

Each of the transistors shown in FIG. 1 is typically selected to have a channel width $W_k$ proportional to the associated weighted current $I_k$ that it accommodates (i.e. $W_k = 2^{k-1} W_1$). An effect of this scaling of the channel widths with the size of each transistor's associated weighted current is that identical drive conditions are achieved for each switch—therefore, for identical drain-source bias $V_{DS}$ and some identical gate-wource bias $V_{GS}$ each scaled transistor produces a drain current $I_D$ equal to its associated weighted current. The reduction of the channel width also reduces parasitic capacitances so that the transistors which are scaled to conduct the smaller weighted currents also have smaller parasitic capacitances. High switching speed is therefore preserved by reducing the parasitic capacitance of the transistors carrying the less significant weighted currents. Unfortunately in any integrated circuit technology there is a lower limit for $W_1$. For example, in MOS devices this lower limit is on the order of 10 μm. If the value of $I_1$ is selected to charge or discharge the parasitic capacitance of its associated minimum dimensioned transistors within the switching time of the gate voltages, the resulting value of the most significant weighted current $I_n$ produces undesirably large currents, power, and transistor sizes. A D/A converter design is therefore needed which enables the use of small weighted currents without decreasing switching speed because of long settling times for the associated parasitic capacitances of the transistors used to route the weighted currents.

To maintain high speeds in the presence of low values of $I_1$ D/A converters are often divided into sections. An example of a sectional D/A converter is disclosed in U.S. Pat. No. 3,893,102 entitled "Digital-to-Analog Converter Using Differently Decoded Bit Groups" issued to James C. Candy on July 1, 1975. In a sectional converter having two equal sections both sections utilize weighted currents of magnitude $I_{N+1} \ldots, I_{2N}$. The output current from the second section is then passed to a current divider which produces a current fraction equal to $2^{-N}$ times the current from the second section. This current fraction is then added to the current from the first section to produce the output current. The output from this sectional converter therefore is the same as the output from a single section converter employing source currents $I_1, \ldots, I_{2N}$ but avoids the use of the small source currents $I_1, \ldots, I_N$. For highest possible speed the current dividing resistors must be integrated with the rest of the circuit. In some integrated circuit technologies, integration of high precision resistors is not feasible and therefore a new approach is required to maximize speed.

SUMMARY OF THE INVENTION

In accordance with the illustrated preferred embodiments, D/A converters are presented which enable the use of small weighted currents without decreasing switching speed due to long settling times of parasitic capacitances. A set of n current sources provide a set of weighted currents $I_1, \ldots, I_n$ which are related by $I_k = 2^{k-1} I_1$. In response to an input number, these currents are selectively coupled to an output summing rail to produce an outut current proportional to the input number.

Figure 2:
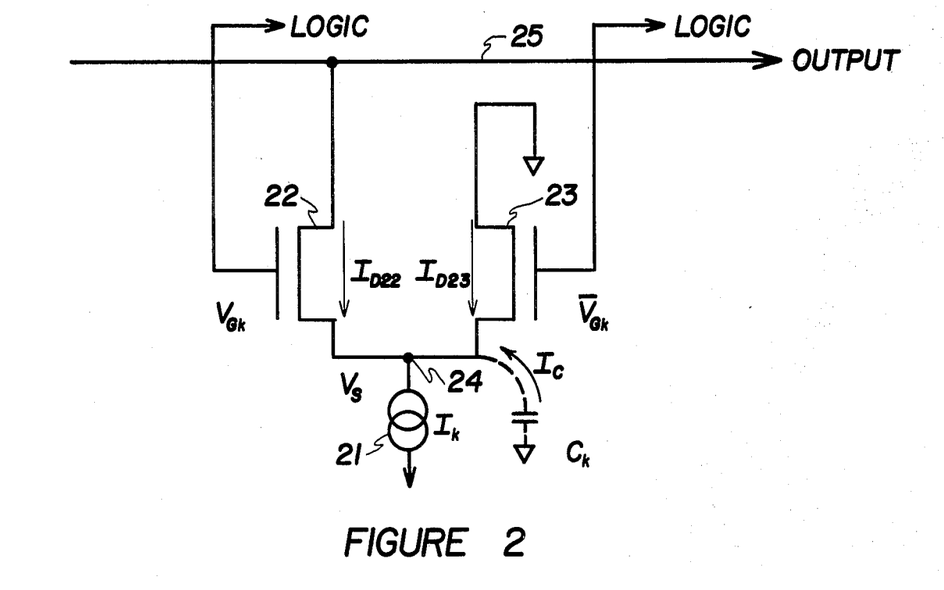
FIG. 2 presents a more detailed drawing of a bit cell of FIG. 1 to illustrate the effect of parasitic capacitance on switching speed.

Each current source is part of an associated bit cell which controls the selective coupling of that current source to the summing rail. The input number is represented as an n-bit binary number for use in controlling the routing of the weighted currents. The bit cell which controls the routing of $I_k$ is responsive to the kth bit of the binary number. In each of the bit cells controlled by one of the more significant bits of the binary numbers the current source is connected to a node (hereafter referred to as the shared source node) formed by the sources of a pair of switching transistors which control the routing of the weighted current of the current source as shown in FIG. 2. One of these transistors conducts the weighted current to the summing rail if the associated bit is 1 and the other transistor diverts the weighted current away from the summing rail if the associated bit is 0.

The transistors connected to the shared source node have parasitic capacitances to ground represented in FIG. 2 by the single capacitance $C_k$. To avoid long settling times associated with these capacitances, sufficient current must be supplied to all such nodes to charge and discharge these capacitances within the switching time of the gate voltages to the switching transistors.

According to the present invention, in each bit cell associated with one of the less significant bits of the n-bit binary number the current to the shared source node (i.e. the node between the current source and its switching transistors) is supplemented by currents from a pair of supplementary current sources. These supplementary currents are selected to provide a total current to the shared source node adequate to charge or discharge the parasitic capacitance coupling that node to ground within the switching time $T_S$ of the switching transistor gate voltages.

When the switching transistors couple the weighted current to the summing rail the first supplementary current $I_A$ is routed to the shared source node and the second supplementary current $I_B$ is routed away from that node. When the switching transistors route the weighted current away from the summing rail the first supplementary current $I_A$ is conducted to the summing rail and the second supplementary current $I_B$ is conducted to the common source node. The effect of this routing scheme is that the first supplementary current is always supplied to the summing rail during D/A converter operation, the second supplementary current is always routed away from the summing rail and the weighted current is selectively routed to the summing rail only when its associated bit in the n-bit binary number is 1. The total current to the summing rail from all of the bit cells is therefore the sum of the desired output signal proportional to the input number plus an offset current $I_T$ which is independent of the input number and equals the sum of all of the first supplementary currents from each of the bit cells corresponding to less significant bits of the binary number. The offset current is reproduced by conventional current mirror techniques to produce a current of magnitude $I_T$ which is supplied to the summing rail to cancel the offset current. The resulting output current on the summing rail is therefore proportional to the input number.

DESCRIPTION OF THE PREFERRED EMBODIMENT

The effect of parasitic capacitance settling times on D/A converter switching speed is illustrated by reference to FIGS. 2 and 3. FIG. 2 shows the currents involved in a bit cell which controls the routing of the weighted current $I_k$ in a D/A converter of the type shown in FIG. 1 and discussed in the Background of the Invention. The weighted current $I_k$ is produced by a current source 21. The routing of $I_k$ is controlled by a pair of switching transistors 22 and 23 whose source electrodes are coupled to current source 21 at a shared source node 24. The drain of transistor 22 is coupled to summing rail 25 and the drain of transistor 23 is coupled to ground. When $V_{Gk}$ is sufficiently high and $\overline{V}_{Gk}$ is sufficiently low transistor 22 is on and transistor 23 is off. When $\overline{V}_{Gk}$ is sufficiently high and $V_{Gk}$ is sufficiently low transistor 22 is off and transistor 23 is on.

The parasitic capacitance $C_k$ coupling shared source node 24 to ground can limit switching speed because of a long settling time. The drive conditions on transistors 22 and 23 produce positive values of $I_{D22}$ and $I_{D23}$ so that the current $I_C$ available to discharge $C_k$ is equal to $I_k - I_{D22} - D_{23}$ and is thus less than $I_k$. The rate of change of the voltage $V_S$ on shared source node 24 during discharge $C_k$ is therefore less than $I_k/C_k$ and can produce unacceptably long settling times for small values of $I_k$.

Figure 3:
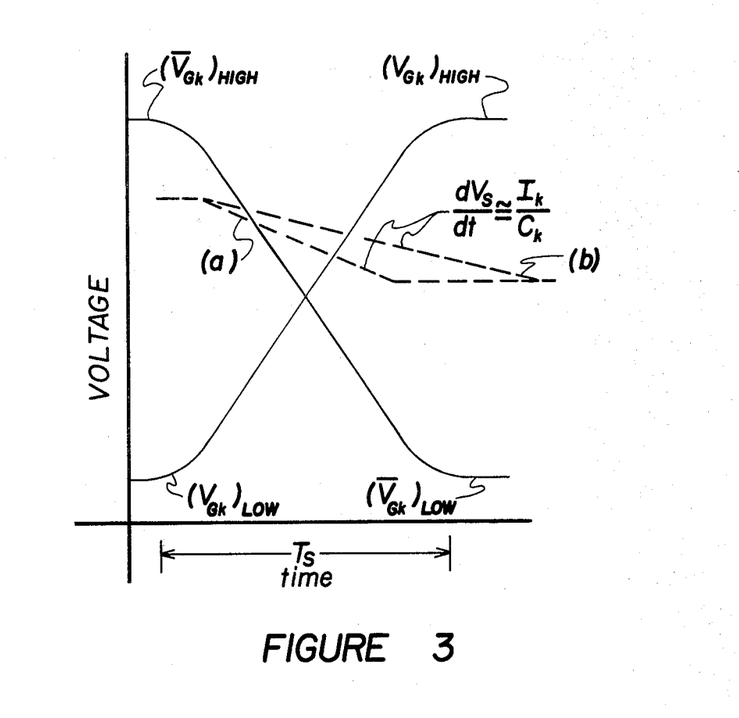
FIG. 3 illustrates the effect of parasitic capacitance on the D/A converter switching speed.

One common situation in which the parasitic capacitance can affect switching speed is illustrated in FIG. 3. In that figure the situation is illustrated in which, because of an imbalance in the electrical characteristics of transistors 22 and 23, transistor 23 requires a smaller gate to source voltage $V_{GS}$ than transistor 22 to support the same source current $I_k$. When $V_{Gk}$ is switching $I_k$ from transistor 23 to transistor 22, the voltage $V_S$ on the shared source node must decrease from an initial value of $(V_{Gk}) - V_{GS23}$ to a final value of $(V_{Gk})_{high} - V_{GS22}$. However, the maximum rate of discharge of $V_S$ is equal to $I_k/C_k$ so that the time for $V_S$ to settle from the initial to the final value can exceed the switching time $T_S$ of $V_{Gk}$ and $\overline{V}_{Gk}$. The curve marked (a) in FIG. 3 illustrates the case when the ratio $I_k/C_k$ is sufficient to settle within $T_S$ and the curve marked (b) illustrates a case when that ratio is insufficient.

Figure 4A:
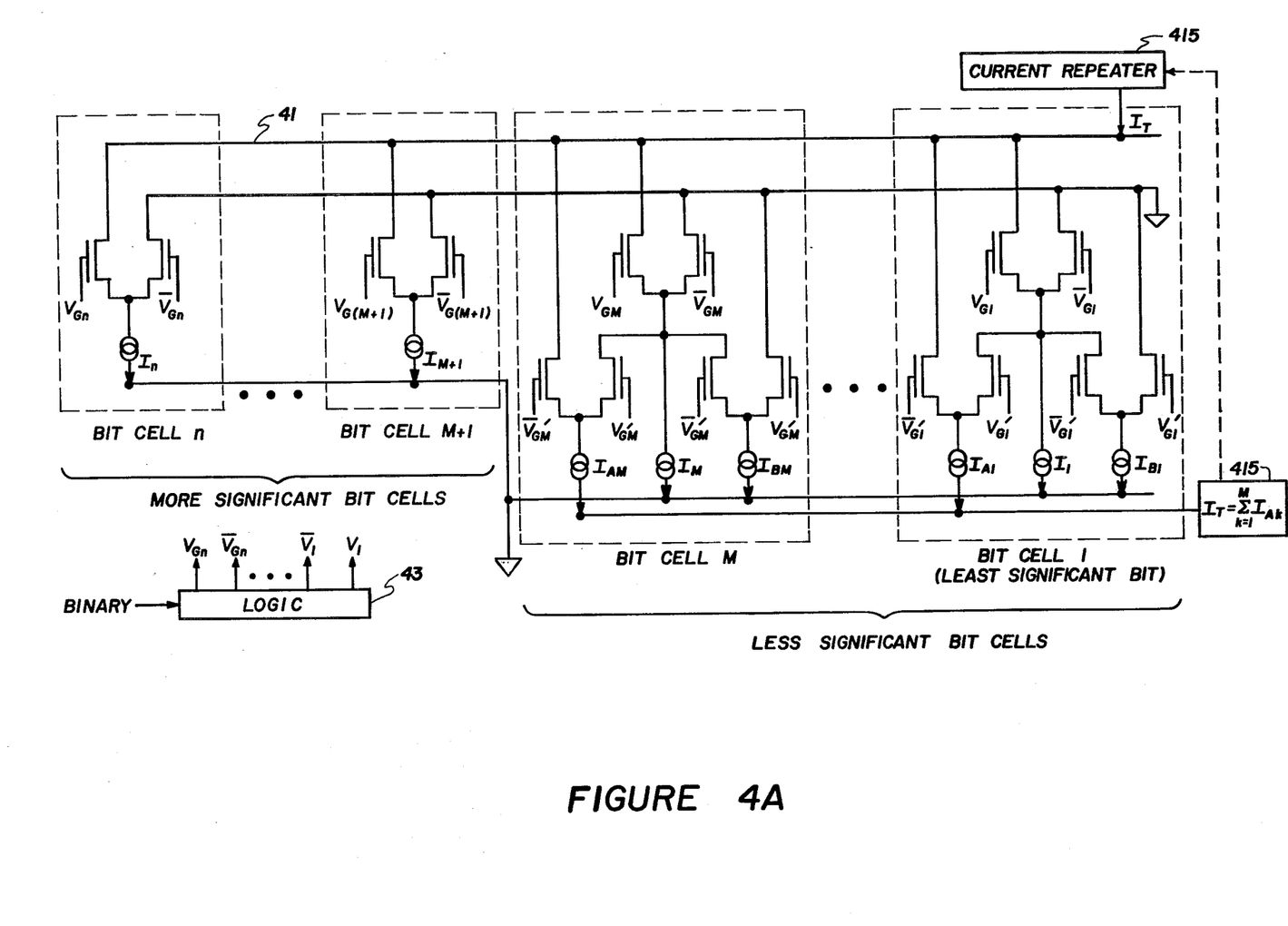
FIG. 4A illustrates a preferred embodiment of the present invention.

In the circuit shown in FIG. 4A a set of n weighted currents $I_1, \ldots, I_n$ are supplied to a summing rail 41 by a set of bit cells $1, \ldots, n$. The weighted currents are related by $I_k = 2^{k-1} I_1$ where k is an integer in the range of $1 \leq k \leq n$. The bit cells selectively route the weighted currents toward or away from summing rail 41 in response to a digital input to provide a net current to summing rail 41 which varies linearly with the digital input. The digital input number is entered through an input logic 43 which can be any one of a number of kinds well known in the prior art. Logic 43 produces a set of n gate voltage signals $V_{G1}, \ldots, V_{Gn}$ and their complementary signals $\overline{V}_{G1}, \ldots, \overline{V}_{Gn}$ for use in controlling the bit cells. Each of the gate voltages is controlled by the value of an associated bit in the n-bit input number. The kth gate voltage $V_{Gk}$ is controlled by the kth bit—$V_{Gk}$ is high if the kth bit is 1 and it is low if the kth bit is 0.

The routing of the kth weighted current $I_k$ by bit cell k is controlled by gate voltages $V_{Gk}$ and $\overline{V}_{Gk}$. The more significant b cells $M+1, \ldots, n$ supplying the more significant weighted currents $I_M, \ldots, I_n$ employ scaled transistors and have the form shown in FIG. 2 and discussed above. The less significant bit cells $1, \ldots, M$ supplying the less significant weighted currents $I_1, \ldots, I_M$ have the form shown in FIG. 4B. In each of the more significant bit cells $M+1, \ldots, n$ the switching transistors which route the weighted current toward or away from summing rail 41 are scaled transistors having a channel width $W_k$ proportional to the weighted current $I_k$ which they route—thus, for $k > M, W_k$ equals $2^{k-M-1} W_{M+1}$. The chance widths $W_k$ for $k > M$ are selected so that the weighted current associated with each of the cells $M+1, \ldots, n$ is adequate to discharge the associated parasitic capacitance of each cell's transistors fast enough to avoid affecting switching speed. In each of the less significant bit cells $1, \ldots, M$ transistor manufacturing limitations prevent reduction of the channel width to a value scaled to its associated weighted current. These cells therefore include supplementary current sources to provide adequate current to the shared source node in each cell to avoid long settling times affecting switching speed. The value of M is typically selected to be the smallest integer for which a channel of width $2^{M-n}W_n$ cannot be produced while simultaneously assuring that the MSB current value does not exceed a value compatible with maximum power requirements. The time delay associated with such a choice will not reduce switching speed.

Figure 4B:
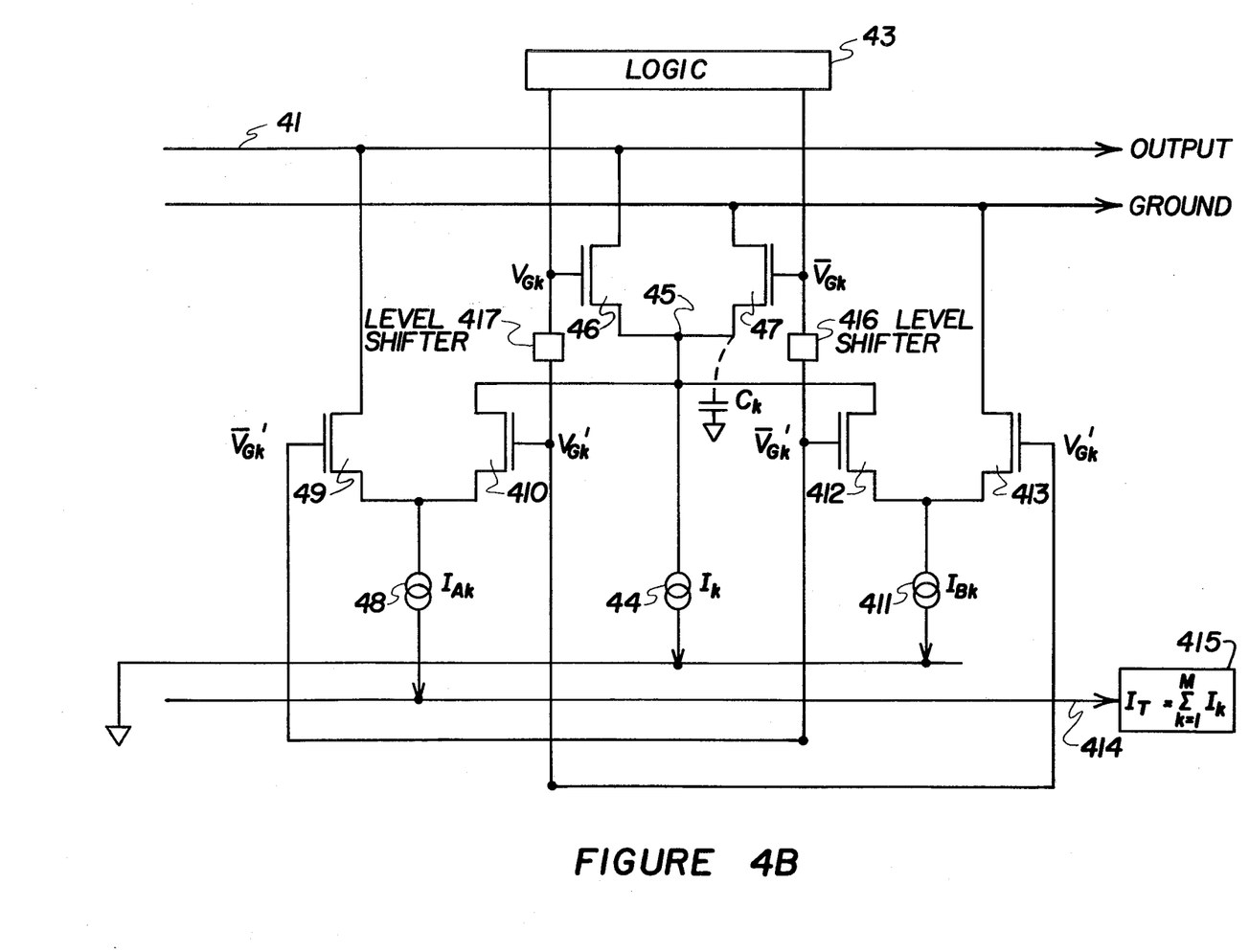
FIG. 4B presents a more detailed drawing of the less significant bit cells which, in accordance with the present invention, supplement the current to the shared source node to avoid long settling times.

In the less significant bit cell shown in FIG. 4B a current source 44 supplies a weighted current $I_k$ to a shared source node 45. As in the more significant bit cell shown in FIG. 2, the source electrodes of a pair of switching transistors 46 and 47 are connected to the shared source node 45 to control the routing of the weighted current. The drain electrode of transistor 46 is coupled to summing rail 41 and the gate electrode is coupled to logic 43 to route the weighted current in response to the applied gate voltage $V_{Gk}$. The drain electrode of transistor 47 is connected to ground and the gate electrode is connected to logic 43 to route the weighted current in response to the applied complementary gate voltage $\overline{V}_{Gk}$. When $V_{Gk}$ is high transistor 46 is on and transistor 47 is off so that $I_k$ is routed to summing rail 41. When $V_{Gk}$ is low transistor 46 is off and transistor 47 is on so that $I_k$ is diverted to ground.

A first supplementary current source 48 providing a first supplementary current $I_{Ak}$ is coupled to summing rail 41 by a transistor 49 and is coupled to shared source node 45 by a transistor 410. A second supplementary current source 411 providing a second supplementary current $I_{Bk}$ is coupled to shared source node 45 by a transistor 412 and is coupled to ground by a transistor 413. The gates of transistors 49, 410, 412 and 413 are connected to logic 43 through level shifters 416 and 417 (implemented by a well known device such as a source follower) to apply a voltage $V_{Gk}'$ to the gates of transistors 410 and 413 and to apply a complementary voltage $\overline{V}_{Gk}'$ to the gates of transistors 49 and 412. The shift in gate voltage produced by level shifters 416 and 417 is required to compensate for the difference in source voltages between transistors such as transistors 46 and 410 in order to provide the correct drain-source voltage to all transistors. When $V_{Gk}$ is high transistors 410 and 413 are on and transistors 49 and 412 are off so that $I_{Ak}$ is directed through node 45 and transistor 46 to summing rail 41 and $I_{Bk}$ is conducted by transistor 413 to ground. When $V_{Gk}$ is low $I_{Ak}$ is conducted by transistor 49 to summing rail 41 and $I_{Bk}$ is directed through node 45 and transistor 47 to ground. Thus, $I_{Ak}$ is always routed to summing rail 41, $I_{Bk}$ is always directed to ground and $I_k$ is selectively directed to summing rail 41 only when $V_{Gk}$ is high. The total current to summing rail 41 from all of the bit cells is therefore $I_S + I_T$ where $$I_T = \sum_{k=1}^{M} I_{Ak}$$

and $I_S$ is the sum of all of the weighted currents associated with the bits which equal 1 in the n-bit binary number. $I_S$ therefore is the desired output signal proportional to the digital input and $I_T$ is a constant current producing an offset in the output current. This routing scheme ensures that at all times either $I_{Ak}$ or $I_{Bk}$ is directed through shared source node 45 so that there is adequate current to discharge the parasitic capacitance $C_k$ within the switching time $T_S$ of $V_{Gk}$.

To eliminate the offset current $I_T$ from the output, each of the first supplementary current sources $I_{Ak}$ is connected to an offset summing rail 414 to produce a total current on this summing rail equal to $I_T$. The current on rail 414 is duplicated by a current repeater 415 shown in FIG. 4A consisting of a pair of current mirrors which are well known in the prior art (For example, see G. R. Wilson, "A Monolithic Junction FET-npn Operational Amplifier," *IEEE J. Sol. St. Cir.*, Vol. SC-3, No. 4, pp. 341-348, Dec. 1968) to provide a duplicate current of magnitude $I_T$ to summing rail 41. The duplicate current cancels the offset current $I_T$ so that the net current at the output is $I_S$. Alternatively, instead of using a current repeater to reproduce $I_T$ a precision current source can be employed which provides a current of magnitude $I_T$. This current source need only match $I_T$ within $I_1/2$ in order to cancel the offset current within the precision of the D/A converter. In the case in which the settling time of the current flowing into the grounded summing rail is not significant, the switching transistors 412 and 413 as well as current source $I_{Bk}$ can be eliminated.

Figure 4C:
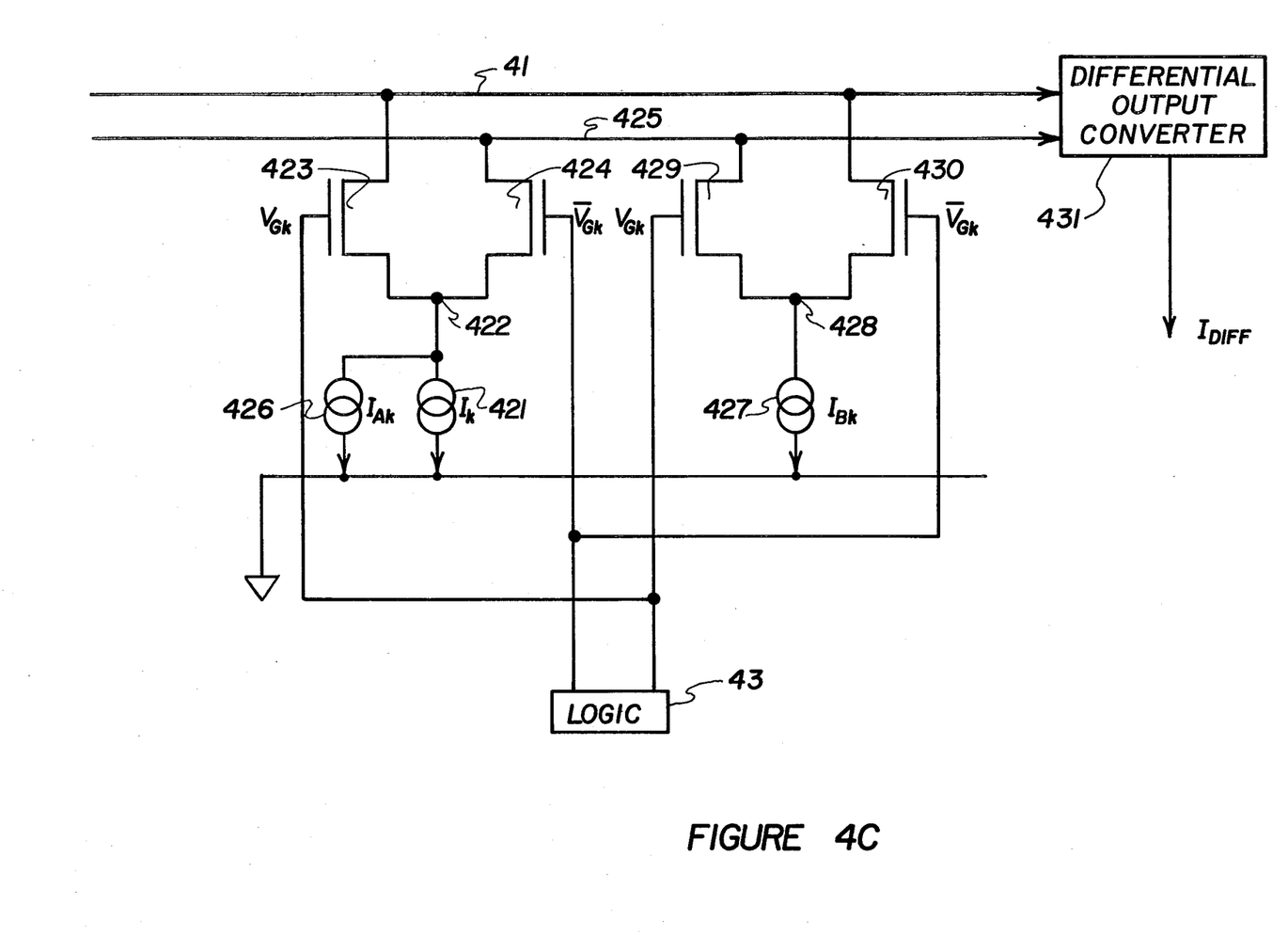
FIG. 4C presents an alternate embodiment of a least significant bit cell.

FIG. 4C presents an alternate embodiment of a less significant bit cell which preserves switching speed while allowing the use of small weighted currents. In that cell a current source 421 providing a weighted current $I_k$ is coupled at a shared source node 422 to the source electrodes of a pair of transistors 423 and 424. The drain electrode of transistor 423 is coupled to summing rail 41 and the drain electrode of transistor 424 is coupled to complementary summing rail 425. A first supplementary current source 426 providing a first supplementary current $I_{Ak}$ is coupled to node 422 to provide sufficient current to discharge the parasitic capacitances coupling that node to ground within the switching time of the gate voltage $V_{Gk}$.

A second supplementary current source 427 is coupled at a second shared source node 428 to the source electrodes of a pair of transistors 429 and 430. Current source 427 is constructed to produce a current $I_{Bk}$ substantially equal to the current from current source 426. The precision of matching must be within a small fraction of $I_1$ in order to avoid affecting the precision of D/A conversion. The drain electrode of transistor 429 is connected to complementary summing rail 425 and the drain electrode of transistor 430 is connected to summing rail 41. The gates of transistors 423, 424, 429 and 430 are connected to logic 43 to apply $V_{Gk}$ to the gates of transistors 423 and 429 and to apply $\overline{V}_{Gk}$ to the gates of transistors 424 and 430. When $V_{Gk}$ is high transistors 423 and 429 are on and transistors 424 and 430 are off so that $I_{Ak} + I_k$ is supplied to summing rail 41 and $I_{Bk}$ is supplied to complementary summing rail 425. When $V_{Gk}$ is low transistors 423 and 429 are off and transistors 424 and 430 are on so that $I_{Ak} + I_k$ is supplied to complementary summing rail 425 and $I_{Bk}$ is supplied to summing rail 41. Summing rails 41 and 425 are coupled to a differential output converter 431 which produces an output current $I_{Diff}$ proportional to the difference between the currents on these two summing rails. Since $I_{Bk}$ is substantially equal to $I_{Ak}$, when $V_{Gk}$ is high the contribution to $I_{diff}$ from bit cell k is $\alpha I_k$ and when $V_{Gk}$ is low the contribution to $I_{Diff}$ from bit cell k is $-\alpha I_k$, where $\alpha$ is a constant of proportionality.

The more significant bit-cells in this alternate embodiment have the form shown in FIG. 2 except that the drain of transistor 23 is coupled to the complementary summing rail. The transistors in each of these more significant bit cells are scaled to the weighted current for that cell. Thus, each of the more significant bit cells likewise contribute to $I_{Diff}$ a current $\alpha$ times its weighted current when its associated gate voltage is high and a current minus $\alpha$ times its weighted current when its associated gate voltage is low. Because of the differential nature of the embodiment shown in FIG. 4C, all offset currents $I_{Ak}$ cancel in the process of forming output current $I_{Diff}$. Current repeaters as used in the embodiments shown in FIGS. 4A and 4B are not required in this alternative embodiment.

The embodiment shown in FIG. 4C can be altered slightly to produce a third embodiment in which the differential output converter 431 is eliminated, rail 41 is coupled to the output and rail 425 is coupled to ground. In this embodiment the offset current can be eliminated by adding a current $$I_T = \sum_{k=1}^{M} I_{Ak}$$

to rail 41 by a current repeater as shown in FIG. 4A.

We claim:

1. A bit cell to controllably provide a weighted current $I_k$, said bit cell comprising:
   a first switch having a switch input and a switch output, said first switch being responsive to an applied control signal $V_{Gk}$ to conduct current applied at the switch input to the switch output when $V_{Gk}$ assumes a first value $V_1$ and to divert that current away from the switch output when $V_{Gk}$ assumes a second value $V_2$;
   a source of current connected to the input of the first switch to supply a total current equal to the sum of the weighted current $I_k$ and a supplementary current; and
   means for subtracting from the output of the first switch a current sufficient to cancel any supplementary current conducted to the output of the first switch so that the net current supplied by the bit cell at the output of the first switch is $I_k$ when $V_{Gk}$ equals $V_1$ and is zero when $V_{Gk}$ equals $V_2$.

2. A bit cell as recited in claim 1 wherein the control signal $V_{Gk}$ makes transitions between its first value $V_1$ and its second value $V_2$ in a switching time $T_S$ and wherein the total current supplied to the input of the first switch is sufficient to alter the charge on parasitic capacitances in the first switch to enable the current at the output of the first switch to settle to essentially a steady state value within the switching time $T_S$ of the control signal $V_{Gk}$.

3. A bit cell as recited in claim 1 wherein the first switch comprises:
   a first transistor coupling the switch input to the switch output; and
   a second transistor connected to the switch input, said first and second transistors being responsive to $V_{Gk}$ to conduct current at the switch input to the switch output when $V_{Gk}$ equals $V_1$ and to divert that current away from the switch output when $V_{Gk}$ equals $V_2$.

4. A bit cell as recited in claim 3 wherein said second transistor connects the switch input to ground to divert the current at the switch input to ground when $V_{Gk}$ equals $V_2$.

5. A bit cell as recited in claim 3 wherein said second transistor connects the switch input to a complementary switch output to divert the current at the switch input to the complementary switch output when $V_{Gk}$ equals $V_2$.

6. A bit cell as recited in claim 3 wherein the first and second transistors are scaled to the magnitude of the total current.

7. A bit cell as recited in claim 1 wherein the source of current is responsive to $V_{Gk}$ to make the supplementary current assume a first amplitude $I_{Ak}$ when $V_{Gk}$ equals $V_1$ and assume a second amplitude $I_{Bk}$ when $V_{Gk}$ equals $V_2$.

8. A bit cell as recited in claim 7 wherein said source of current comprises:
   a source of weighted current $I_k$ connected to the input of the first switch;
   a source of first supplementary current $I_{Ak}$;
   a source of second supplementary current $I_{Bk}$; and
   switch means connected to the sources of first and second supplementary currents, connected to the switch input and the switch output of the first switch and responsive to $V_{Gk}$ for conducting $I_{Ak}$ to the switch input when $V_{Gk}$ equals $V_1$ and for conducting $I_{Ak}$ to the switch output and $I_{Bk}$ to the switch input when $V_{Gk}$ equals $V_2$.

9. A bit cell as recited in claim 8 wherein said switch means comprises:
   a second switch connecting the source of first supplementary current $I_{Ak}$ to the switch input and switch output of the first switch, said second switch being responsive to $V_{Gk}$ to conduct $I_{Ak}$ to the switch input when $V_{Gk}$ equals $V_1$ and to conduct $I_{Ak}$ to the switch output when $V_{Gk}$ equals $V_2$; and
   a third switch connecting the source of second supplementary current $I_{Bk}$ to the switch input of the first switch, said third switch being responsive to $V_{Gk}$ to conduct $I_{Bk}$ to the input when $V_{Gk}$ equals $V_2$ and to divert $I_{Bk}$ away from the input when $V_{Gk}$ equals $V_1$.

10. A bit cell as recited in claim 1 wherein the means for subtracting comprises:
    a summing rail connected to the output of the first switch;
    a complementary summing rail connected to the first switch to receive the current supplied to the input of the first switch when $V_{Gk}$ equals $V_2$;
    a source of second supplementary current, said second supplementary current being substantially equal to the total current supplied to the input of the first switch when $V_{Gk} = V_1$;
    a second switch having an input connected to the source of second supplementary current, a first output connected to the summing rail and a second output connected at the complementary summing rail, said second switch being responsive to $V_{Gk}$ to conduct current supplied to its input to the complementary summing rail when $V_{Gk}$ equals $V_1$ and to the summing rail when $V_{Gk}$ equals $V_2$; and
    means connected to the summing rail and to the complementary summing rail for producing a difference signal $I_{diff}$ proportional to the difference between the current on the summing rail and the current on the complementary summing rail.

11. An improved digital-to-analog converter of the type in which a source of weighted currents provides a set of weighted currents $I_k$ for $k=1, \ldots n$ for some integer n greater than 1 where the $I_k$ are related by $I_k=2^{k-1}I_1$ and where each weighted current $I_k$ has an associated first switch which is responsive to an associated control signal $V_{Gk}$ to conduct $I_k$ to a summing rail when $V_{Gk}$ assumes a first value $V_{1k}$ and to divert $I_k$ away from the summing rail when $V_{Gk}$ assumes a second value $V_{2k}$, said improvement comprising:

means connected to the M switches associated with M weighted currents $I_1, \ldots, I_M$ (where M is an integer in the range $n \geq M \geq 1$) for adding to each of the weighted currents $I_1, \ldots, I_M$ an associated supplementary current sufficient to alter the charge on parasitic capacitances in the associated switch at a rate which enables the current supplied to the summing rail by that switch to settle to essentially a steady state value within the switching time of the associated control signal $V_{Gk}$; and means connected to the summing rail for subtracting from the summing rail a current sufficient to cancel any supplementary current conducted to the summing rail so that the net current to the summing rail is the sum of all $I_k$ for which $V_{Gk}$ assumes its first value $V_{1k}$.

12. A digital-to-analog converter as recited in claim 11 wherein the M weighted currents $I_1, \ldots, I_M$ are the M least significant weight currents in the digital-to-analog converter.

13. A digital-to-analog converter as recited in claim 11 wherein the means for adding to each of the weighted currents $I_1, \ldots, I_M$ an associated supplementary current comprises:

a pair of sources of supplementary currents providing respectively a first supplementary current $I_{Ak}$ and a second supplementary current $I_{Bk}$ for each value of k in the range $1 \leq k \leq M$;

for each value of k in the range $1 \leq k \leq M$, a second switch connected to the input of the first switch and connected to the sources of currents $I_{Ak}$ and $I_{Bk}$ and responsive to $V_{Gk}$ to conduct $I_{Ak}$ to the input of the first switch when $V_{Gk}$ equals $V_{1k}$ and to conduct $I_{Bk}$ to the input of the first switch when $V_{Gk}$ equals $V_{2k}$;

and wherein the means for subtracting comprises a source of current equal to minus the sum of the $I_{Ak}$ connected to the summing rail to supply this current to the summing rail, said second switch being connected to the summing rail to conduct $I_{Ak}$ to the summing rail when $V_{Gk}$ equals $V_{2k}$, whereby the net current to the summing rail is the sum of those weighted currents for which $V_{Gk}$ equals $V_{1k}$.

14. A digital-to-analog converter as recited in claim 11 wherein the means for adding to each of the weighted currents $I_1, \ldots, I_M$ an associated supplementary current comprises means, coupled to each first switch associated with a weighted current $I_k$ for $k=1, \ldots, M$, for supplementing each of the $I_k$ for $k=1, \ldots, M$ in order to supply to the associated first switch a current of magnitude $I_k + I_{Ak}$ where $I_{Ak}$ is the supplementary current associated with $I_k$, and wherein the means for subtracting comprises:

a complementary summing rail connected to each of the first switches, each of said first switches conducting its associated weighted current to the complementary summing rail when $V_{Gk}$ equals $V_{2k}$;

a source of supplementary currents $I_{Bk}$ for $k=1, \ldots, M$ where $I_{Bk}$ is substantially equal to $I_{Ak}$;

means, connected to the source of supplementary currents $I_{Bk}$, to the summing rail and to the complementary summing rail for $k=1, \ldots, M$ and responsive to the control signals $V_{Gk}$ for conducting $I_{Bk}$ to the complementary summing rail when $V_{Gk}$ equals $V_{1k}$ and for conducting $I_{Bk}$ to the summing rail when $V_{Gk} = V_{2k}$; and means, connected to the summing rail and to the complementary summing rail for generating a difference signal $I_{diff}$ proportional to the current in the summing rail minus the current in the complementary summing rail.

15. A method of enhancing the switching speed of a switch in which the switching speed is a decreasing function of an input current $I_k$ applied at an input of the switch, said switch in response to a first state of a control signal $V_{Gk}$ conducting the input current to an output and said switch in response to a second state of $V_{Gk}$ diverting the input current away from the output, said method comprising the steps of:

enhancing the input current to a value $I_k + I_{Ak}$ when the control signal is in its first state and to $I_k + I_{Bk}$ when the control signal is in its second state to reduce the switching speed; and subtracting from the output a current which, when $V_{Gk}$ assumes its first state value, is greater than when $V_{Gk}$ assumes its second state value by an amount $I_{Ak} - I_{Bk}$ whereby the net current conducted to the output increases by $I_k$ when $V_{Gk}$ makes a transition from its second state to its first state.

* * * * *

UNITED STATES PATENT AND TRADEMARK OFFICE
CERTIFICATE OF CORRECTION

PATENT NO. : 4,405,916
DATED : September 20, 1983
INVENTOR(S) : Thomas Hornak and Gary L. Baldwin It is certified that error appears in the above—identified patent and that said Letters Patent is hereby corrected as shown below:

In column 4, line 10, "$I_k-I_{D22}-D_{23}$" should read -- $I_k-I_{D22}-I_{D23}$ --; line 63, "chance" should read -- channel --.

In column 5, line 40, "$V_{GK}$," should read -- $V'_{GK}$ --.

In column 8, line 57, "at" should read -- to --.

Signed and Sealed this

Fifteenth Day of May 1984

[SEAL]

Attest:

GERALD J. MOSSINGHOFF

Attesting Officer

Commissioner of Patents and Trademarks